(12) United States Patent
Mergens et al.

(10) Patent No.: US 7,978,451 B2
(45) Date of Patent: Jul. 12, 2011

(54) CIRCUIT ARRANGEMENT COMPRISING AN ELECTRONIC COMPONENT AND AN ESD PROTECTION ARRANGEMENT

(75) Inventors: Markus Mergens, Munich (DE); Magnus-Maria Hell, Munich (DE); Michael Mayerhofer, Deisenhofen (DE)

(73) Assignee: Infineon Technologies AG, Neubiberg (DE)

( * ) Notice: Subject to any disclaimer, the term of this patent is extended or adjusted under 35 U.S.C. 154(b) by 255 days.

(21) Appl. No.: 12/209,307

(22) Filed: Sep. 12, 2008

(65) Prior Publication Data
US 2009/0073620 A1    Mar. 19, 2009

(30) Foreign Application Priority Data
Sep. 14, 2007   (DE) .................. 10 2007 044 047

(51) Int. Cl.
*H02H 3/22* (2006.01)
(52) U.S. Cl. .......................... 361/56; 361/111
(58) Field of Classification Search .............. 361/56, 361/111
See application file for complete search history.

(56) References Cited

U.S. PATENT DOCUMENTS

| | | | |
|---|---|---|---|
| 5,901,022 A | 5/1999 | Ker | |
| 5,982,600 A * | 11/1999 | Cheng | ............... 361/111 |
| 6,040,968 A | 3/2000 | Duvvury et al. | |
| 6,064,249 A | 5/2000 | Duvvury et al. | |
| 6,125,021 A * | 9/2000 | Duvvury et al. | ............... 361/56 |
| 6,424,013 B1 | 7/2002 | Steinhoff et al. | |
| 6,621,673 B2 | 9/2003 | Lin et al. | |
| 7,280,329 B2 | 10/2007 | Kim et al. | |
| 7,405,861 B2 * | 7/2008 | Floyd | ............... 359/290 |
| 2006/0209479 A1 * | 9/2006 | Grombach et al. | ............ 361/56 |
| 2008/0042206 A1 | 2/2008 | Kim et al. | |

FOREIGN PATENT DOCUMENTS

DE    10 2004 041 831 A1    3/2005

OTHER PUBLICATIONS

Esmark, K., et al., "Advanced Simulation Methods for ESD Protection Development," 2003, pp. 41-47, Elsevier.

* cited by examiner

*Primary Examiner* — Danny Nguyen
(74) *Attorney, Agent, or Firm* — Slater & Matsil, L.L.P.

(57) ABSTRACT

A description is given of a circuit arrangement including at least one electronic component having first and second terminals, and comprising an ESD protection arrangement against disturbance pulses, is the ESD protection arrangement connected via connection terminals in parallel with the electronic component between the first and second terminals. The ESD protection arrangement includes a first ESD protection unit and a second ESD protection unit, that is connected in parallel with the first ESD protection unit and that reacts more rapidly than the first protection unit to a voltage rise at the connection terminals with the formation of a conductive current path between the connection terminals.

20 Claims, 3 Drawing Sheets

CIRCUIT ARRANGEMENT COMPRISING AN ELECTRONIC COMPONENT AND AN ESD PROTECTION ARRANGEMENT

This application claims priority to German Patent Application 10 2007 044 047.4, which was filed Sep. 14, 2007 and is incorporated herein by reference.

TECHNICAL FIELD

The present invention relates to a circuit arrangement comprising an electronic component, for example, a semiconductor component, such as a MOS transistor, and comprising an ESD (Electrostatic Discharge) protection arrangement.

BACKGROUND

An "electronic component" should be understood hereinafter to mean any active or passive electronic components, circuits comprising a plurality of individual components, or microelectromechanical systems (MEMS). Such electronic components can be destroyed if voltage pulses whose amplitudes are greater than the limit values permissible for the respective component occur between component terminals.

Consideration shall be given to MOS transistors, for example, in which a parasitic bipolar transistor can be formed by the source zone, the drain zone and the body zone—which is arranged between the source zone and the drain zone and is doped complementarily to the source zone and the drain zone. This parasitic transistor switches on if the voltage between the load path terminals (or drain and source terminals) of the MOS transistor exceeds a limit value typical of the component. This switch-on of the parasitic transistor leads to destruction of the component. Moreover, voltage pulses between the source terminal and the gate terminal of a MOS transistor can damage a gate dielectric arranged between gate and source, which likewise leads to destruction or at least to a malfunction of the component.

In the case of capacitors, in particular in the case of integrated capacitors, excessively high voltages can lead to damage or destruction of the capacitor dielectric. Accordingly, in the case of MEMS components, damage to microstructures of the components can occur as a result of high voltages and the high field strengths associated therewith.

In the case of bipolar transistors, voltage pulses can likewise lead to destruction of the component. A malfunction brought about by voltage pulses can be just as critical as destruction. Thus, even short high voltage pulses can suffice to alter the current gain and the high-frequency behavior of a bipolar transistor, which can have considerable effects on further circuit components connected to the transistor.

High voltages representing a hazard for the component can result, for example, from an electrostatic discharge (ESD), from coupled-in electromagnetic interference (EMI) or from similar disturbances.

SUMMARY OF THE INVENTION

In one aspect, the present invention provides a circuit arrangement that includes at least one semiconductor component and an ESD protection arrangement connected in parallel with the at least one semiconductor component, which reliably protects the semiconductor component against disturbance pulses.

In the case of the circuit arrangement according to an embodiment of the invention, an ESD protection arrangement is connected in parallel with the terminals of at least one semiconductor component. The ESD protection arrangement has a first ESD protection unit and a second ESD protection unit that is connected in parallel with the first ESD protection unit. In this case, the second ESD protection unit is embodied in such a way that it reacts to a voltage rise at its connection terminals more rapidly than the first ESD protection unit with the formation of a conductive current path between the connection terminals. The second ESD protection unit can be dimensioned with regard to size and design in particular such that it cannot dissipate the entire power introduced by a disturbance pulse.

"Disturbance pulse" should be understood hereinafter to mean any electromagnetic pulses, for example, ESD pulses and EMI pulses.

The first ESD protection unit, which is slower or more sluggish in comparison with the second ESD protection unit, essentially serves, after its reaction to a disturbance pulse, to dissipate the electrical charge induced by the pulse in a short time in conjunction with a low voltage dropped across the first ESD protection unit. In this case, the first ESD protection unit can be dimensioned, in particular, to be significantly larger than the second ESD protection unit, that is to say the first ESD protection unit has in the switched-on state a significantly smaller forward resistance than the second ESD protection unit or a significantly higher current-carrying capacity.

Moreover, the first ESD protection unit can be realized, in comparison with the second ESD protection unit, such that it is able, owing to its design, to take up a larger power loss than the second ESD protection unit without being destroyed.

The second ESD protection unit is optimized, in contrast to the first ESD protection unit, with regard to reacting to a pulse as rapidly as possible and thus avoiding the situation where a voltage across the at least one semiconductor component reaches excessively high values that possibly damage the component before the first ESD protection unit actually reacts.

BRIEF DESCRIPTION OF THE DRAWINGS

The present invention is explained in more detail below with reference to figures. In the figures, unless indicated otherwise, identical reference symbols designate identical circuit components and signals with the same meaning.

DETAILED DESCRIPTION OF ILLUSTRATIVE EMBODIMENTS

Figure 1:
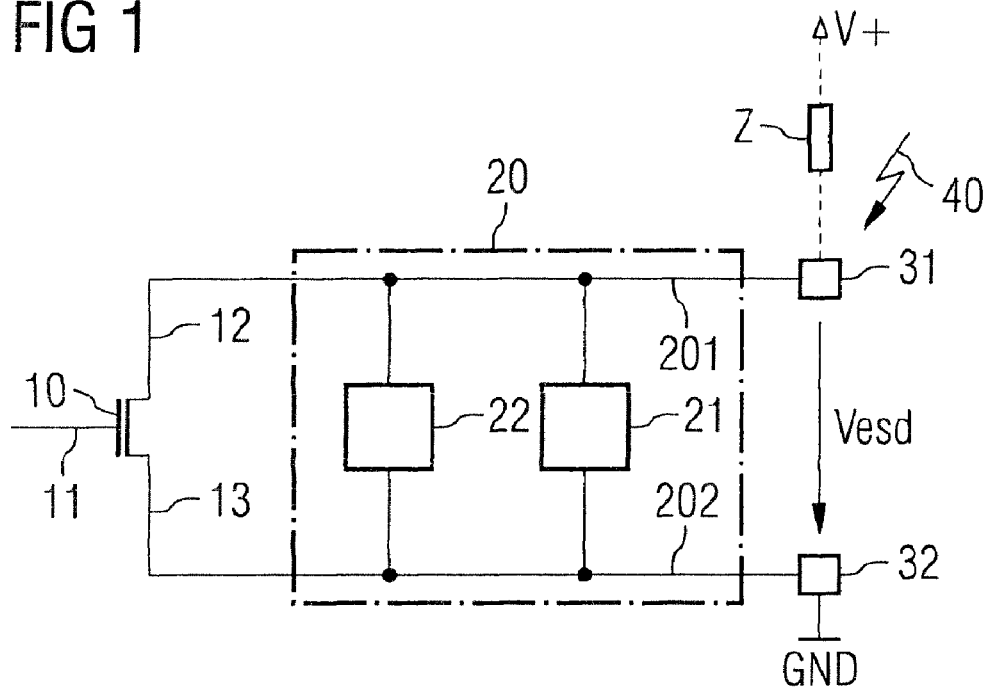
FIG. 1 schematically shows an exemplary embodiment of the circuit arrangement according to the invention comprising a semiconductor component and an ESD protection arrangement connected in parallel with the semiconductor component.

FIG. 1 shows an exemplary embodiment of a circuit arrangement according to the invention comprising an electronic component 10 having first and second terminals 12, 13 and an ESD protection arrangement 20, which is connected in parallel with the electronic component 10 between the first and second terminals 12, 13. It should be assumed for the further explanation that the electronic component 10 is an active semiconductor component, in particular a MOS transistor. However, it should be pointed out that the invention is not restricted either to active components or to semiconductor components, but rather can be applied to any active and passive components which are to be protected against overvoltages. Further examples of such components include integrated capacitances or microelectromechanical systems (MEMS).

The MOS transistor illustrated in FIG. 1 has a gate terminal 11, which forms a control terminal, and drain and source terminals, which form the first and second terminals 12, 13 in the example. A load path of this MOS transistor 10 runs between the first and second terminals 12, 13. The MOS transistor 10 serves for example for switching a load Z and is connected by its load path 12-13 between connection terminals 31, 32, via which the MOS transistor 10 can be connected in series with the load Z (illustrated by dashed lines) between terminals for first and second supply potential V+, GND or positive supply potential V+ and reference potential GND.

In the example illustrated, the ESD protection arrangement 20 is connected in parallel with the load path 12-13 of the MOS transistor 10 between the connection terminals 31, 32 via connection terminals 201, 202. The task of the ESD protection arrangement 20, when a disturbance pulse 40 occurs which can lead to a rapid rise in the electrical potential at the first connection terminal 31, is to produce a conductive current path between the connection terminals 31, 32 in order to dissipate the electrical charge induced by the disturbance pulse to the terminal for the reference potential GND and thus to protect the MOS transistor against an overvoltage and thus against destruction. The ESD protection arrangement 20 has two ESD protection units, a first ESD protection unit 21 and a second ESD protection unit 22. These two ESD protection units 21, 22, which are illustrated schematically as circuit blocks in FIG. 1, are connected in parallel with one another and in each case between the connection terminals 31, 32. The two ESD protection units 21, 22 differ in terms of their reaction time when a disturbance pulse, such as disturbance pulse 40, occurs, and by at least one of the following parameters: current-carrying capacity, maximum processable power loss, maximum energy dissipating capacity. In this case, the second ESD protection unit 22 is realized such that, in the case of a voltage rise caused by the disturbance pulse 40, it reacts more rapidly than the first ESD protection unit 21, in order to protect the electronic component 10 against an overvoltage in the initial phase of the disturbance pulse 40, while the first ESD protection unit 21 is designed to dissipate the charge induced by the disturbance pulse 40 in conjunction with a low power loss.

Figure 2:
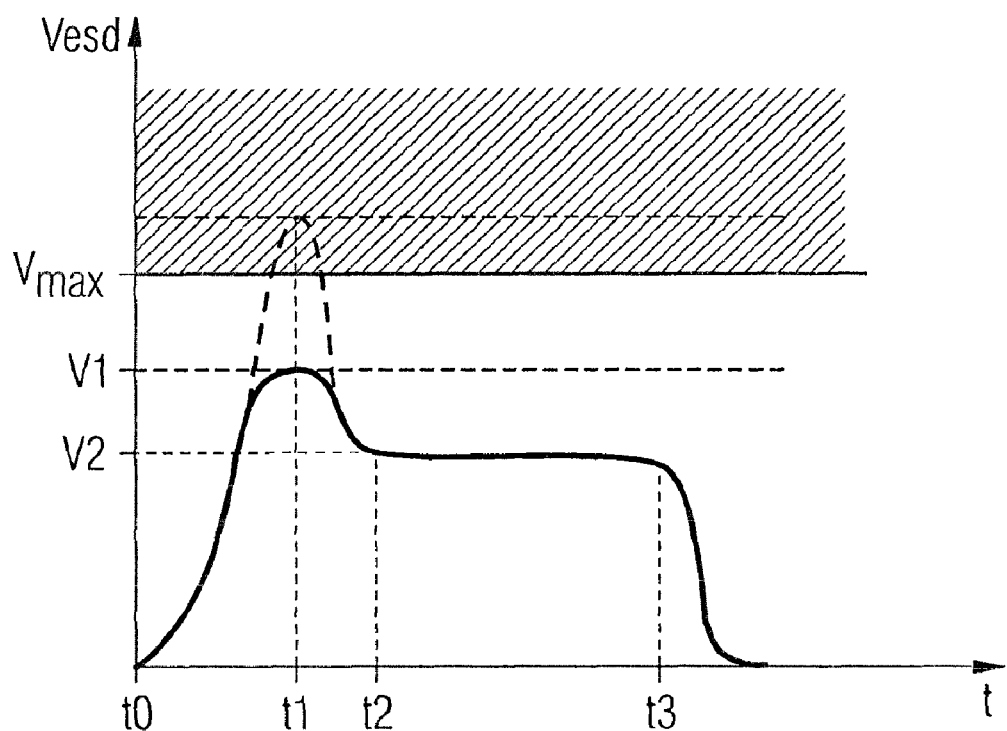
FIG. 2 illustrates the voltage across the semiconductor component when an ESD pulse occurs.

FIG. 2 illustrates the temporal profile of a voltage Vesd between the connection terminals 31, 32 assuming a disturbance pulse occurring starting from the instant t0 at the connection terminal 31. In FIG. 2, $V_{max}$ denotes a maximum permissible voltage that is permitted to occur across the load path of the MOSFET 10 without destroying the MOS transistor. This maximum permissible voltage $V_{max}$ corresponds to the voltage at which a parasitic bipolar transistor of the MOSFET 10 would switch on. The MOSFET 10 is a so-called high-voltage DMOS transistor (DMOS=Double Diffused Metal Oxide Semiconductor), for example. The maximum permissible voltage $V_{max}$ of such a MOSFET is design-dependent and can be 70 V, for example. For voltages above this maximum voltage, which are illustrated as a hatched voltage range in FIG. 2, a parasitic bipolar transistor that is present and unavoidable in the MOS transistor would switch on, which would lead to destruction of the component.

The task of the ESD protection arrangement 20 is to reliably protect the MOSFET 10 against voltages greater than the maximum permissible voltage. The maximum permissible operating voltage, that is to say the voltage that has to be reliably blocked by the MOSFET during operation, must not, however, be influenced by the ESD protection arrangement 20. In other words, the ESD protection arrangement 20 is permitted to switch on only for voltages above the maximum permissible operating voltage but must reliably switch on before the permissible maximum voltage $V_{max}$ is reached. In the case of a component having a maximum voltage $V_{max}$=70 V, the permissible operating voltage is 60 V, for example.

The voltage profile of the voltage Vesd brought about by the disturbance pulse as illustrated in FIG. 2, the voltage being referred to hereinafter as the disturbance voltage, can be subdivided temporally into a plurality of segments. In a first time segment proceeding from the instant t0, the disturbance voltage Vesd first rises until the second ESD protection unit 22 switches on and thereby prevents a further rise in the disturbance voltage. The second ESD protection unit 22 limits the disturbance voltage Vesd to a first limit value V1, which is determined by the design of the second ESD protection unit 22 and which lies below the permissible maximum voltage $V_{max}$ but above the permissible operating voltage. In a second time segment, which begins at an instant t1, the disturbance voltage Vesd falls to a second, smaller limit value V2 in the example illustrated. This fall in the disturbance voltage Vesd is caused by the switch-on of the first ESD protection unit 21. In this case, the instant t2 denotes the instant at which the first ESD protection unit 21 is completely switched on. The disturbance voltage Vesd remains at the limit value predetermined by the first ESD protection unit 21 until a later instant t3, at which point the electrical charge induced by the disturbance pulse has been dissipated, such that the disturbance voltage Vesd falls steeply.

Depending on the realization of the first ESD protection unit 21, the voltage Vesd across the component 10 to be protected, with the commencement of the first ESD protection unit 21, can also remain at the voltage level V1—to which the second ESD protection unit 22 initially limits the voltage Vesd—until the voltage subsides. What is essential is that the second ESD protection unit 22 rapidly limits the voltage Vesd, upon commencement of a disturbance pulse, to a tolerable value for the semiconductor component.

FIG. 2 illustrates by dashed lines the voltage profile of the disturbance voltage Vesd which would be established if only the first slower or more sluggish ESD protection unit 21 were present. The rise times of customary disturbance pulses, in particular of customary ESD disturbance pulses, lie between about 200 ps and about 10 ns, while the switch-on delay of the first ESD protection unit 21 lies above about 5 ns, for example, such that the disturbance voltage Vesd, in the absence of the second ESD protection unit 22, could rise to values above the maximum voltage $V_{max}$ during the initial phase of the disturbance pulse. The total duration of a disturbance pulse lies in the region of about 100 ns, for example. The width of the voltage pulse between the instants t0 and t2 determines the electrical charge to be dissipated by the second ESD protection unit 22 at the beginning of the disturbance pulse. This "width" lies between about 0.2 ns and about 20 ns. The electrical charge to be dissipated by the first ESD protection unit 21 during this time period is in the region of about 1 μC or less.

Figure 3:
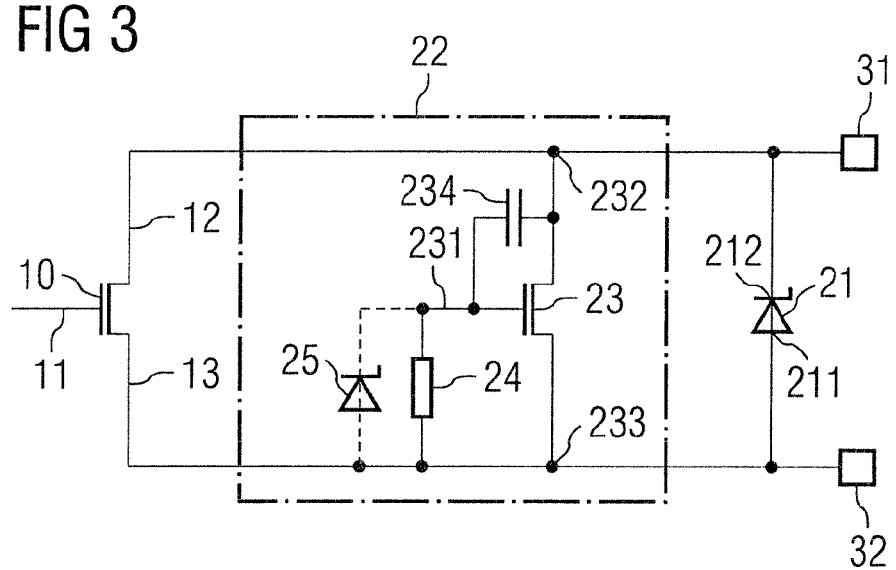
FIG. 3 shows an exemplary circuitry realization of the ESD protection arrangement with a first ESD protection unit having a zener diode or a component operating in a manner corresponding to a zener diode.
Figure 4:
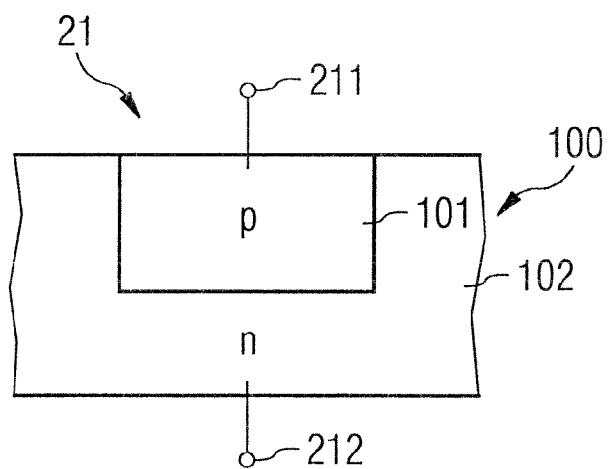
FIG. 4 shows an exemplary realization of the zener diode of the first ESD protection unit.

Referring to FIG. 3, the first ESD protection unit 21 can be realized, for example, as a zener diode or as a component that functions in a manner corresponding to a zener diode. FIG. 4 shows one possibility for the realization of such a component at the semiconductor level. This component 21 comprises, in a semiconductor body 100, a pn junction between a p-doped zone 101 that is coupled to terminal 211 and an n-doped zone 102 that is coupled to terminal 212. In this case, the p-type zone 101 corresponds to that connection of the first ESD protection unit 21 that is connected to the connection 233, while the n-type zone corresponds to the connection that is connected to the connection 232. The pn junction is realized as a "deep pn junction", which is arranged with a large part of its area at a distance from the surface of the semiconductor body 100. The distance is between about 3 μm and about 6 μm, for example.

In this component, a voltage breakdown upon application of a voltage in the reverse direction occurs deep within the semiconductor body 100, where enough semiconductor material is available in the surroundings to dissipate the heat that arises without destroying the component. The semiconductor body 100 in which the ESD protection unit 21 is integrated is advantageously the same semiconductor body in which the component to be protected is also integrated. The current-carrying capacity of such a first ESD protection unit 21 realized as a zener diode increases as the area of the pn junction increases. As the area increases, however, the time duration that elapses until a voltage breakdown propagates to the entire pn junction and the component reaches its maximum current-carrying capacity also increases. This "delay time" until a complete turn-on of the zener diode in the reverse direction can be up to about 20 ns, depending on the area of the pn junction.

Figure 5:
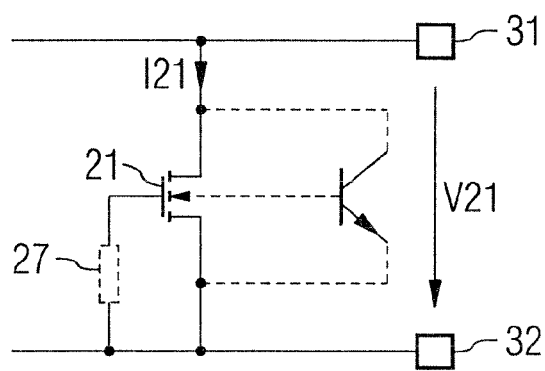
FIG. 5 shows a further exemplary realization of the first ESD protection unit using a MOS transistor.

As an alternative to a zener diode, the first ESD protection unit 21, referring to FIG. 5, can also be realized as a so-called grounded gate MOS transistor (GGMOS), the load path or drain-source path of which is connected between the connection terminals 31, 32 and thus in parallel with the terminals 12, 13 of the component 10 to be protected. A gate terminal and a source terminal of the GGMOS transistor are short-circuited, such that the conductive behavior of the transistor is determined exclusively by a parasitic bipolar transistor that is formed between the drain terminal and the source terminal in a known manner by the drain zone, the body zone and the source zone, of which the source zone and the drain zone are in each case doped complementarily to the body zone. This parasitic bipolar transistor, which is illustrated by dashed lines in FIG. 5, switches on or triggers if a voltage V21 between the connection terminals 31, 32 reaches the value of a triggering voltage of the parasitic bipolar transistor of the GGMOS transistor.

Figure 6:
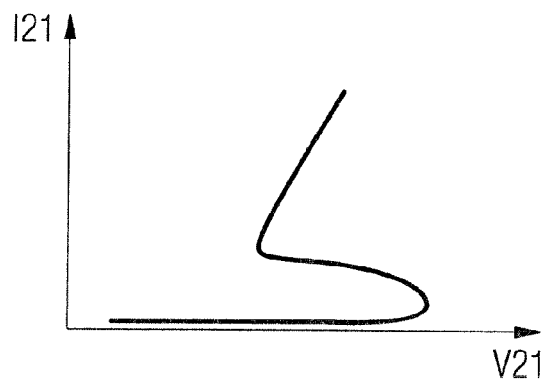
FIG. 6 illustrates the function of the MOS transistor when a disturbance pulse occurs (parasitic mode)

Upon triggering, the GGMOS transistor exhibits a pronounced "snapback" behavior, which becomes clear with reference to FIG. 6, in which a current I21 flowing via the load path of the transistor is plotted as a function of a voltage V21 across the load path. Before the parasitic bipolar transistor triggers, no current flows and the load path voltage V21 rises up to the triggering voltage, at which a current flow commences. As the current rises, the load path voltage V21 then abruptly decreases again or "snaps back" and, as the current rises further, then rises linearly with rising current I21. Such a GGMOS transistor in which a parasitic bipolar transistor determines the conductive behavior is also referred to as a snapback bipolar transistor.

The robustness of a MOS transistor used as a GGMOS transistor or snapback bipolar transistor against damage upon triggering increases as the active transistor area increases. With the increase in the transistor area, however, there is also an increase in parasitic capacitances, for example the drain-gate capacitance or the drain-source capacitance, which are charged prior to triggering and which thus slow down the triggering operation.

In the example illustrated in FIG. 3, the second ESD protection unit 22 has a MOS transistor 23 having a control terminal (gate terminal) 231 and first and second load path terminals (drain and source terminals) 232, 233. The load path 232-233 of the MOS transistor 23 is connected between the connection terminals 31, 32 and thus in parallel with the first ESD protection unit 21. The control terminal 231 of the MOS transistor 23 is connected to one of its load terminals, the source terminal in the example, via a resistor 24. A voltage drop across the resistor 24 controls the conductive behavior of the MOS transistor 23. The resistor 24 is therefore referred to hereinafter as the control resistor. The MOS transistor 23, which is illustrated in FIG. 3, and the gate terminal 231 that is coupled to the source terminal via the control resistor 24, is also referred to as a "gate coupled" MOS transistor (GC-MOS).

The reference symbol 234 designates the gate-drain capacitance which is present internally in the MOS transistor 23 and which can also be referred to as the Miller capacitance. When a disturbance pulse occurs at the connection terminal 31, the potential at the control terminal 231 of the MOS transistor 23 is raised via the Miller capacitance 234, whereby the MOS transistor 23 is driven in the on state and limits a rise in the voltage between the connection terminals 31, 32. In order to limit the gate potential of the MOS transistor 23, a zener diode 25 can optionally be connected in parallel with the control resistor 24.

The current that results from the disturbance pulse and flows to the Miller capacitance 234 brings about at the control resistor 24 a voltage drop that is chosen such that the MOS transistor 23 is operated in the so-called MOS operation mode. In this case, the conductive behavior is controlled by means of the gate-source voltage. In this case, the resistance of the control resistor 24 is coordinated with the currents that flow in the case of a disturbance pulse such that the MOS transistor 23 switches on before the voltage between the connection terminals 31, 32 has actually risen to an extent such that its parasitic bipolar transistor triggers. With the use of transistors of identical design for the transistor 23 of the second ESD protection circuit 22 and the transistor (FIG. 5) of the first ESD protection unit 21, the transistor 23 of the second ESD protection circuit 22 driven in the MOS operation mode would switch on more rapidly than the transistor of the first ESD protection unit 21 operating in the snapback operation mode, even if both transistors had identical transistor areas, that is dimensioned with identical sizes. In this case, the maximum power loss, that is the power loss that can be taken by a component without being destroyed, is nevertheless smaller for the transistor 23 of the second protection unit 22 than for the transistor of the first ESD protection unit 21. The reason for this is that in the snapback operation mode, in contrast to the MOS operation mode, the power loss—in a manner comparable with the diode illustrated in FIG. 4—is converted into heat deep in the semiconductor body where this heat can be handled by the component better than in the MOS operation mode, wherein the heat is more likely to arise near the surface. This smaller maximum permissible power loss of the transistor 23 of the second ESD protection unit 22 is tantamount to a lower current-carrying capacity for a given voltage across the component.

In general, the MOS transistor 23 of the second ESD protection unit 22 can have a lower current-carrying capacity than the zener diode 25 or the transistor of the first ESD protection unit 21 since the transistor only serves to limit the voltage in the initial phase of the disturbance pulse until the first ESD protection circuit commences. The MOS transistor 23 can be realized such that it is smaller than a transistor of the first ESD protection unit 21, that is with a correspondingly smaller transistor area and a correspondingly smaller gate capacitance, which increases the switch-on speed of the transistor 23 of the second ESD protection unit 22 in comparison with the switch-on speed of the transistor of the first ESD protection unit 21.

With regard to the use of a diode in the first ESD protection unit 21, it should also be mentioned that this diode, on account of the "deep" breakdown alone, explained with reference to FIG. 4 (that is a large amount of surrounding silicon (=volume)), and even with an identical component area, can endure more (heat) power loss than, e.g., a MOS transistor, with breakdown nearer the surface or during operation in the MOS conduction mode. The diode is slower, however, with regard to its switch-on behavior in the reverse direction. A MOS transistor that is connected in parallel with the diode and that can react to a disturbance pulse with its drain-to-gate capacitance is faster but would have to be very large in order to be able to cope with the entire energy. In one variant of the invention, therefore, the compromise consists in providing a "large" (but slow) diode and a "small" (and fast) transistor.

It should be pointed out that the MOS transistor of the first ESD protection unit 21, in a departure from the explanation above, can also be realized as a GCMOS transistor, which is illustrated in FIG. 5 by a resistor 27 (illustrated by dashed lines) between the gate terminal and the source terminal. Such a GCMOS transistor, which is operated in the MOS operation mode, can be made smaller than a GGMOS transistor or snapback transistor since it does not have to withstand a voltage breakdown. Owing to the larger current-carrying capacity, however, this MOS transistor has a larger transistor area and larger gate capacitance than the transistor 23 of the second ESD protection unit 22 and is thus slower or more sluggish when a disturbance pulse occurs.

Figure 7:
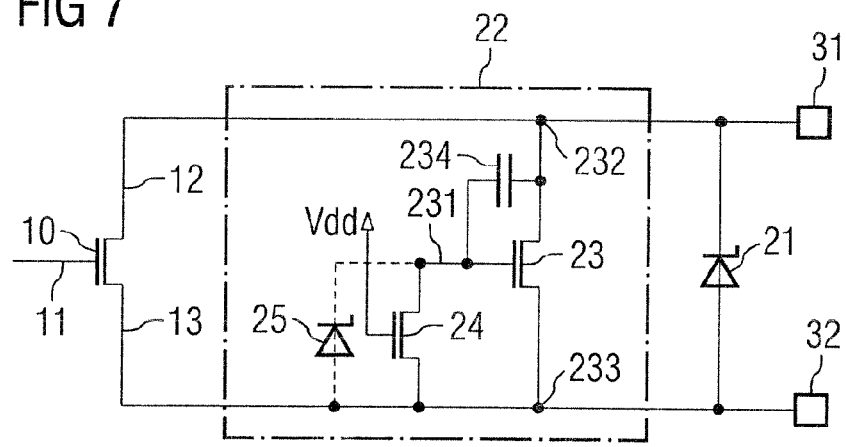
FIG. 7 shows a further exemplary circuitry realization of the ESD protection arrangement.

Referring to FIG. 7, the control resistor 24 can be realized as a further MOSFET, the load path (drain-source path) of which is connected between the gate and source terminals of the MOSFET 23 and the control terminal (gate terminal) which is connected to a terminal for a logic supply potential Vdd. In normal operation, that is when no disturbance pulse is present, the further MOSFET 24 is turned on and thereby blocks the MOSFET 23. Upon the occurrence of a disturbance pulse at the connection terminal 31 and an associated rise in the potential at the gate terminal of the MOSFET 23 above the logic supply potential Vdd, the MOSFET 24 is turned off and enables the MOSFET 23 to be driven in the on state for dissipating the disturbance pulse in the initial phase until the commencement of the first ESD protection unit 21.

Figure 8:
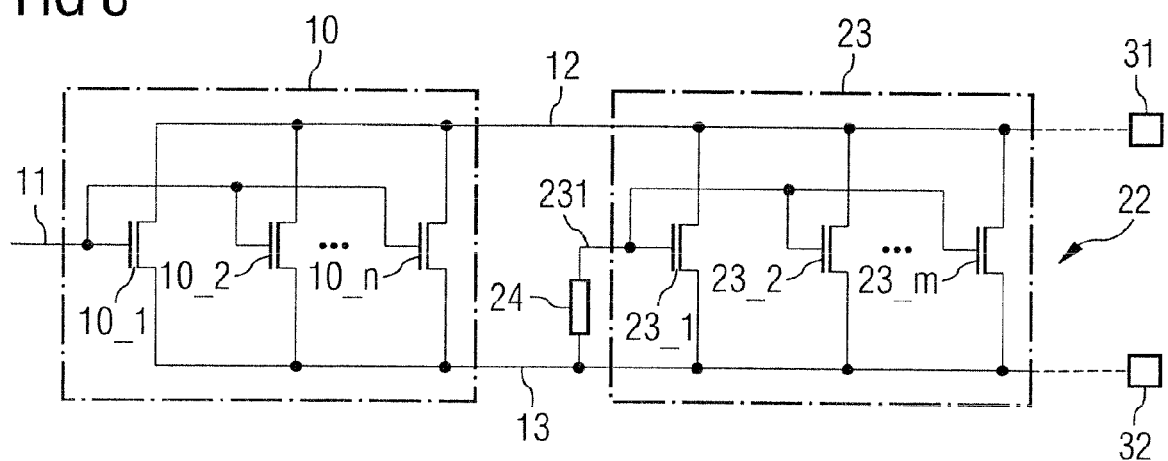
FIG. 8 shows a circuit arrangement comprising a cellularly constructed MOS transistor as a semiconductor component and comprising a cellularly constructed MOS transistor as part of the ESD protection arrangement.

Referring to FIG. 8, the MOS transistor 10 to be protected can be realized in particular in cellular fashion with a plurality of identically constructed transistor cells. In FIG. 8, the individual transistor cells are illustrated by MOS transistors 10_1, 10_2, 10_n which are connected in parallel with one another and driven jointly. In accordance with the MOS transistor 10 to be protected, the MOS transistor 23 of the second ESD protection unit 22 can also be realized in cellular fashion with a plurality of transistor cells of identical type. In FIG. 8 these transistor cells are illustrated as parallel-connected transistors 23_1, 23_2, 23_m which are driven jointly, that is connected jointly to the control resistor 24. The number of transistor cells of the MOS transistor 23 of the ESD protection unit 22 lies between about 200 and about 500, for example. The MOS transistor 10 to be protected and the MOS transistor 23 of the second ESD protection unit 22 are advantageously realized in a common semiconductor body. These two transistors can also be realized in a common cell array of identical transistor cells, in which case separate gate terminals are to be provided for the transistor cells of the MOS transistor 10 to be protected and for the transistor cells of the MOS transistor 23 of the second ESD protection unit 22. The number of transistor cells of the MOS transistor 10 to be protected lies above the number of transistor cells of the MOS transistor 23 of the protection unit 22 and is about 500 to about 1000, for example, in relation to the abovementioned numerical example for the second ESD protection unit 22.

The figure does not illustrate the first ESD protection unit 21 connected in parallel with the second ESD protection unit 22. The first ESD protection unit 21 can be realized as a zener diode or as a GGMOS transistor or GCMOS transistor in accordance with the explanations regarding FIGS. 3, 4 and 5. Such a MOS transistor can be realized in the same semiconductor body as the MOS transistor 10 to be protected and the MOS transistor 23 of the second ESD protection unit 22 and can be constructed in cellular fashion. A larger current-carrying capacity of the MOS transistor of the first ESD protection unit 21 in comparison with the current-carrying capacity of the MOS transistor 23 of the second ESD protection unit 22 is achieved by means of a larger number of transistor cells. This larger number of transistor cells in comparison with the transistor 23 makes the MOS transistor of the first ESD protection unit slower or more sluggish, however. When a disturbance pulse occurs during operation, the transistor 23 of the second ESD protection unit 22 limits the voltage between the terminals 31, 32 until the more sluggish transistor of the first ESD protection unit 21 commences.

It should be pointed out that the ESD protection arrangements explained comprising two ESD protection units can be connected between any terminals of a component or a circuit between which a potentially damaging voltage resulting from a disturbance pulse can occur. Thus, the ESD protection arrangement explained can, for example, also be provided between a gate terminal and a source terminal of a MOS transistor to be protected.

Furthermore, the ESD protection arrangement is not restricted to the use of a MOS transistor in the second ESD protection unit 22. Rather, any component that reacts to a disturbance pulse more rapidly than the first ESD protection unit 21 with the formation of a conductive current path is suitable for the second ESD protection unit 22. Thus, in the second ESD protection unit 22, by way of example, a zener diode corresponding to FIG. 4 could also be provided, in which the area of the pn junction is dimensioned to be so (small) that it reacts to a disturbance pulse more rapidly than, for example, a parallel-connected zener diode or a parallel-connected MOS transistor of the first ESD protection unit 21.

Furthermore, a GGMOS transistor could also be provided in the second ESD protection unit 22, the transistor being dimensioned such that it reacts to a disturbance pulse more rapidly than, for example, a parallel-connected zener diode or a parallel-connected MOS transistor of the first ESD protection unit 21. A high current-carrying capacity and a fast reaction behavior preclude one another in the manner explained, such that the requirement for a faster reaction behavior of the second ESD protection unit 22 in comparison with the first ESD protection unit 21 is tantamount to a lower current-carrying capacity of the second ESD protection unit 22 in comparison with the first ESD protection unit 21.

The faster component 23 of the second ESD protection unit 22 in comparison with the component of the first ESD protection unit 21 is dimensioned for example such that it can dissipate between about 10% and about 30% of the energy contained in a disturbance pulse, without being destroyed, before the first ESD protection unit 21 commences. In the case of components of identical design in the first and second ESD protection units 21, 22 this means that the ratio between the size or area of the component of the ESD second protection unit 22 and the size or area of the component of the first ESD protection unit 21 is between about 10:90 (=0.11) and about 30:70 (=0.43).

What is claimed is:

1. A circuit arrangement comprising:
    an electronic component having first and second terminals; and
    an ESD protection arrangement against disturbance pulses, which is coupled via connection terminals in parallel with the electronic component between the first and second terminals, the ESD protection arrangement comprising:
        a first ESD protection unit; and
        a second ESD protection unit, coupled in parallel with the first ESD protection unit, wherein the second ESD protection unit reacts more rapidly than the first ESD protection unit to a voltage rise at the connection terminals with a formation of a conductive current path between the connection terminals, wherein
            the second ESD protection unit comprises a MOS transistor having load path terminals coupled between the first and second terminals and having a control terminal, the control terminal of the MOS transistor being short-circuited with one of the load path terminals or being coupled to one of the load path terminals via a resistor, and
            the MOS transistor of the second ESD protection unit comprises a cellularly constructed MOS transistor having a first number of transistor cells.

2. The circuit arrangement as claimed in claim 1, wherein the first ESD protection unit has a higher current-carrying capacity than the second ESD protection unit.

3. The circuit arrangement as claimed in claim 1, wherein the first ESD protection unit comprises a zener diode or a MOS transistor.

4. The circuit arrangement as claimed in claim 3, wherein the first ESD protection unit comprises a MOS transistor having a load path coupled between the first and second terminals and having a control terminal, the control terminal of the MOS, transistor being short-circuited with one of the load path terminals or being coupled to one of the load path terminals via a resistor.

5. The circuit arrangement as claimed in claim 1, further comprising a voltage limiting element coupled in parallel with the resistor.

6. The circuit arrangement as claimed in claim 5, wherein the voltage limiting element comprises a zener diode.

7. The circuit arrangement as claimed in claim 1, wherein the electronic component comprises a cellularly constructed MOS transistor having a second number of transistor cells.

8. The circuit arrangement as claimed in claim 1, wherein the electronic component and the first ESD protection unit are integrated in a common semiconductor body.

9. The circuit arrangement as claimed in claim 1, wherein the first number of transistor cells is between about $10^3$ and about $10^5$, and wherein the second number of transistor cells is between about 200 and about 500.

10. The circuit arrangement as claimed in claim 5, wherein the resistor has a resistance between about 100Ω and about 1000Ω.

11. The circuit arrangement as claimed in claim 1 wherein the electronic component comprises an active semiconductor component.

12. The circuit arrangement as claimed in claim 1, wherein the electronic component comprises a passive component.

13. The circuit arrangement as claimed in claim 12, wherein the passive component comprises a capacitance integrated in or on a semiconductor body.

14. The circuit arrangement as claimed in claim 1, wherein the electronic component comprises a microelectromechanical system.

15. A method of operating a circuit arrangement comprising an electronic component having first and second terminals, the method comprising:
    receiving a disturbance voltage between the first and second terminals;
    switching on a first ESD protection unit coupled via first and second terminals in parallel with the electronic component between the first and second terminals, switching on the first ESD unit comprising forming a conductive current path between the first and second terminals, wherein
        the first ESD protection unit comprises a MOS transistor having load path terminals coupled between the first and second terminals and having a control terminal, the control terminal of the MOS transistor being short-circuited with one of the load path terminals or being coupled to one of the load path terminals via a resistor, and
        the MOS transistor of the first ESD protection unit comprises a cellularly constructed MOS transistor having a second number of transistor cells; and
    after switching on the first ESD protection unit, switching on a second ESD protection unit coupled between the first and second terminals.

16. The method of claim 15, wherein the first ESD protection unit reacts faster than the second ESD protection unit.

17. The method of claim 15, wherein switching on the first ESD protection unit comprises switching on the first ESD protection unit when the disturbance voltage reaches a first voltage level.

18. The method of claim 17, wherein switching on the second ESD protection unit comprises clamping the first and second terminals to a second voltage level, the second voltage level less than the first voltage level.

19. The method of claim 17, wherein the electronic component comprises a cellularly constructed MOS transistor having a second number of transistor cells.

20. A circuit arrangement comprising:
    an electronic component having first and second terminals, the electronic component comprising a cellularly constructed MOS transistor having a first number of transistor cells; and
    an ESD protection arrangement against disturbance pulses, which is coupled via connection terminals in parallel with the electronic component between the first and second terminals, the ESD protection arrangement comprising:

a first ESD protection unit; and a second ESD protection unit, coupled in parallel with the first ESD protection unit, wherein the second ESD protection unit reacts more rapidly than the first ESD protection unit to a voltage rise at the connection terminals with a formation of a conductive current path between the connection terminals, wherein the second ESD protection unit comprises a MOS transistor having load path terminals coupled between the first and second terminals and having a control terminal, the control terminal of the MOS transistor being short-circuited with one of the load path terminals or being coupled to one of the load path terminals via a resistor, and the MOS transistor of the second ESD protection unit comprises a cellularly constructed MOS transistor having a second number of transistor cells.

* * * * *